(12) United States Patent
Bhat et al.

(10) Patent No.: US 10,063,197 B2
(45) Date of Patent: Aug. 28, 2018

(54) CIRCUITS FOR POWER-COMBINED POWER AMPLIFIER ARRAYS

(71) Applicants: Ritesh Bhat, New York, NY (US); Harish Krishnaswamy, New York, NY (US)

(72) Inventors: Ritesh Bhat, New York, NY (US); Harish Krishnaswamy, New York, NY (US)

(73) Assignee: The Trustees of Columbia University in the City of New York, New York, NY (US)

( * ) Notice: Subject to any disclaimer, the term of this patent is extended or adjusted under 35 U.S.C. 154(b) by 195 days.

(21) Appl. No.: 14/639,700

(22) Filed: Mar. 5, 2015

(65) Prior Publication Data

US 2017/0040956 A1    Feb. 9, 2017

Related U.S. Application Data

(60) Provisional application No. 61/948,198, filed on Mar. 5, 2014.

(51) Int. Cl.
*H03F 3/68* (2006.01)
*H03F 3/21* (2006.01)
(Continued)

(52) U.S. Cl.
CPC .......... *H03F 3/211* (2013.01); *H03F 1/0277* (2013.01); *H03F 1/223* (2013.01); *H03F 3/19* (2013.01);
(Continued)

(58) Field of Classification Search
CPC ............. H03F 3/211; H03F 3/19; H03F 1/223
(Continued)

(56) References Cited

U.S. PATENT DOCUMENTS 5,867,061 A    2/1999  Rabjohn et al.
6,359,513 B1 *  3/2002  Kuo ..................... H03F 1/0288
                                              330/264

(Continued)

OTHER PUBLICATIONS

Acar, M. et al., "Analytical Design Equations for Class-E Power Amplifiers with Finite DC-Feed Inductance and Switch On-Resistance", In Proceedings of the International Symposium on Circuits and Systems (ISCAS '07), New Orleans, LA, US, May 27-30, 2007, pp. 2818-2821.

(Continued)

*Primary Examiner* — Khanh V Nguyen
*Assistant Examiner* — Khiem Nguyen
(74) *Attorney, Agent, or Firm* — Byrne Poh LLP (57) ABSTRACT

Circuits for power-combined power amplifier array are provided, the circuits comprising: an input splitter coupled to an input that provides a plurality of outputs; a plurality of power amplifier unit cells, each power amplifier unit cell coupled to a corresponding output of the input splitter and each power amplifier unit cell providing an output signal at an output of the power amplifier unit cell; and a power combiner having an output, a plurality of inputs, each input coupled to the output of a corresponding power amplifier unit cell, and a plurality of C-L-C-section equivalents, each having an input connected to a corresponding one of the plurality of inputs of the power combiner and an output connected to the output of the power combiner.

6 Claims, 8 Drawing Sheets

(51) Int. Cl.
*H03F 1/02* (2006.01)
*H03F 1/22* (2006.01)
*H03F 3/24* (2006.01)
*H03F 3/72* (2006.01)
*H03F 3/19* (2006.01)

(52) U.S. Cl.
CPC .............. *H03F 3/245* (2013.01); *H03F 3/72* (2013.01); *H03F 2200/411* (2013.01); *H03F 2200/541* (2013.01); *H03F 2203/21106* (2013.01); *H03F 2203/21142* (2013.01); *H03F 2203/7227* (2013.01); *H03F 2203/7236* (2013.01)

(58) Field of Classification Search
USPC .............................................. 330/295, 124 R
See application file for complete search history.

(56) References Cited

U.S. PATENT DOCUMENTS

| | | | |
|---|---|---|---|
| 6,995,616 | B2 | 2/2006 | Behzad et al. |
| 7,071,785 | B2 | 7/2006 | Behzad |
| 7,215,206 | B2 | 5/2007 | Dupuis et al. |
| 7,242,245 | B2 * | 7/2007 | Burns ................ H03F 3/211 330/124 R |
| 7,439,802 | B2 | 10/2008 | Tsai et al. |
| 7,560,994 | B1 | 7/2009 | Lee et al. |
| 7,612,616 | B2 | 11/2009 | Deng et al. |
| 7,696,828 | B2 | 4/2010 | Chang |
| 7,714,664 | B2 | 5/2010 | Kanaya et al. |
| 7,728,662 | B2 * | 6/2010 | Apel ................ H03F 1/0244 330/124 D |
| 8,018,288 | B2 | 9/2011 | Duster et al. |
| 8,102,213 | B2 | 1/2012 | Tasic et al. |
| 8,111,104 | B2 | 2/2012 | Ahadian et al. |
| 8,368,469 | B2 | 2/2013 | Mohammadi et al. |
| 8,497,738 | B2 | 7/2013 | Guo |
| 8,620,234 | B2 | 12/2013 | Yang et al. |
| 9,118,288 | B2 | 8/2015 | Lai et al. |
| 9,413,298 | B2 | 8/2016 | Nobbe et al. |
| 9,614,541 | B2 | 4/2017 | Chakrabarti et al. |
| 2004/0085138 | A1 | 5/2004 | Franca-Neto |
| 2004/0113689 | A1 | 6/2004 | Hajimiri et al. |
| 2005/0110594 | A1 * | 5/2005 | Culliton ................ H01P 5/12 333/125 |
| 2006/0261890 | A1 | 11/2006 | Floyd et al. |
| 2006/0270367 | A1 | 11/2006 | Burgener et al. |
| 2007/0075784 | A1 | 4/2007 | Pettersson et al. |
| 2008/0030489 | A1 | 2/2008 | Kim et al. |
| 2008/0036486 | A1 | 2/2008 | Gattiker et al. |
| 2010/0060353 | A1 | 3/2010 | Grebennikov et al. |
| 2012/0268205 | A1 | 10/2012 | Presti |
| 2012/0319782 | A1 | 12/2012 | Nam et al. |
| 2013/0293308 | A1 | 11/2013 | Gupta |
| 2013/0335147 | A1 | 12/2013 | Ma et al. |

OTHER PUBLICATIONS

Acar, M. et al., "Generalized Analytical Design Equations for Variable Slope Class-E Power Amplifiers", In Proceedings of the International Conference on Electronics, Circuits, and Systems (ICECS '06), Nice-Acropolis, FR, Dec. 10-13, 2006, pp. 431-434.
Afshari, E. et al., "Electrical Funnel: A Broadband Signal Combining Method", In Proceedings of IEEE International Solid-State Circuits Conference (ISSCC '06), San Francisco, CA, US, Feb. 6-9, 2006, pp. 751-760.
Agah, A. et al., "A 34% PAE, 18.6dBm 42-45 GHz Stacked Power Amplifier in 45 nm SOI CMOS", In Proceedings of IEEE Radio Frequency Integrated Circuits Symposium (RFIC), Montreal, QC, CA, Jun. 17-19, 2012, pp. 57-60.
Agah, A. et al., "A 42 to 47-GHz, 8-Bit I/Q Digital-to-RF Converter with 21-dBm PSAT and 16CMOS", In Proceedings of IEEE Radio Frequency Integrated Circuits Symposium (RFIC), Honolulu, HI, US, Jun. 2-4, 2013, pp. 249-252.
Agah, A. et al., "A 45GHz Doherty Power Amplifier with 23% PAE and 18dBm Output Power, in 45nm SOI CMOS", In Proceedings of IEEE International Microwave Symposium (IMS2012), Montreal, QC, CA, Jun. 17-22, 2012, pp. 1-3.
Avratoglou, N et al., "Analysis and Design of a Generalized Class E Tuned Power Amplifier", In IEEE Transactions on Circuits and Systems, vol. 36, No. 8, Aug. 1989, pp. 1068-1079.
Balteanu, A. et al., "A 45-GHz, 2-bit Power DAC with 24.3 dBm Output Power, >14 Vpp Differential Swing, and 22% Peak PAE in 45-nm SOI CMOS", In Proceedings of IEEE Radio Frequency Integrated Circuits Symposium (RFIC), Montreal, QC, CA, Jun. 17-19, 2012, pp. 319-322.
Balteanu, I. et al., "A 2-bit, 24 dBm, Millimeter-Wave SOI CMOS Power-DAC Cell for Watt-Level High-Efficiency, Fully Digital m-ary QAM Transmitters", In IEEE Journal of Solid-State Circuits, vol. 48, No. 5, May 2013, pp. 1126-1137.
Bhat, R. et al., "Large-Scale Power Combining and Mixed-Signal Linearizing Architectures for Watt-Class mmWave CMOS Power Amplifiers", In IEEE Transactions on Microwave Theory and Techniques, vol. 63, No. 2, Jan. 2015, pp. 703-718.
Bhat, R. et al., "Large-Scale Power-Combining and Linearization in Watt-Class mmWave CMOS Power Amplifiers", In Proceedings of IEEE Radio Frequency Integrated Circuits Symposium (RFIC), Seattle, WA, US, Jun. 2-4, 2013, pp. 283-286.
Bohsali, M. and Niknejad, A.M., "Current Combining 60GHz CMOS Power Amplifiers", In Proceedings of IEEE Radio Frequency Integrated Circuits Symposium (RFIC), Boston, MA, US, Jun. 7-9, 2009, pp. 31-34.
Chakrabarti, A. and Krishnaswamy, H., "Design Considerations for Stacked Class-E-like mmWave Power DACs in CMOS", In IEEE International Microwave Symposium Digest, Jun. 2-7, 2013, pp. 1-4.
Chakrabarti, A. and Krishnaswamy, H., "Dual-Output Stacked Class-EE Power Amplifiers in 45nm SOI CMOS for Q-band Applications", In Proceedings of IEEE Compound Semiconductor Integrated Circuit Symposium (CSICS '12), La Jolla, CA, US, Oct. 14-17, 2012, pp. 1-4.
Chakrabarti, A. and Krishnaswamy, H., "High Power, High Efficiency Stacked mmWave Class-E-like Power Amplifiers in 45nm SOI CMOS", In Proceedings of IEEE Custom International Circuits Conference (CICC), San Jose, CA, US, Sep. 9-12, 2012, pp. 1-4.
Chakrabarti, A. and Krishnaswamy, H., "High-Power, High-Efficiency, Class-E-like, Stacked mmWave PAs in SOI and Bulk CMOS: Theory and Implementation", In IEEE Transactions on Microwave Theory and Techniques, vol. 62, No. 8, Aug. 2014, pp. 1686-1704.
Chakrabarti, A. and Krishnaswamy, H., "An Improved Analysis and Design Methodology for RF Class-E Power Amplifiers with Finite DC-feed Inductance and Switch On-Resistance", In Proceedings of the IEEE International Symposium on Circuits and Systems (ISCAS '12), Seoul, KR, May 20-23, 2012, pp. 1763-1766.
Chen, J. and Niknejad, A., "A Compact 1V 18.6dBm 60GHz Power Amplifier in 65nm CMOS", In Proceedings of the International Solid-State Circuits Conference Digest of Technical Papers (ISSCC '11), San Francisco, CA, US, Feb. 20-24, 2011, pp. 432-433.
Chen, J. et al., "A Digitally Modulated mm-Wave Cartesian Beamforming Transmitter with Quadrature Spatial Combining", In Proceedings of IEEE International Solid-State Circuits Conference Digest of Technical Papers (ISSCC '13), San Francisco, CA, US, Feb. 17-21, 2013, pp. 232-233.
Chowdhury, D. et al., "A Fully Integrated Dual-Mode Highly Linear 2.4GHz CMOS Power Amplifier for 4G WiMax Applications", In IEEE Journal of Solid-State Circuits, vol. 44, No. 12, Dec. 2009, pp. 3393-3402.
Colomb, F. and Platzker, A., "A 3-Watt Q-band GaAs pHEMT Power Amplifier MMIC for High Temperature Operation", In Proceedings of IEEE International Microwave Symposium, San Francisco, CA, US, Jun. 11-16, 2006, pp. 897-900.
Dabag, H. et al., "Analysis and Design of Stacked-FET Millimeter-Wave Power Amplifiers", In IEEE Transactions on Microwave Theory and Techniques, vol. 61, No. 4, Mar. 2013, pp. 1543-1556.

(56) References Cited

OTHER PUBLICATIONS

Datta, K. et al., "A 22.4 dBm Two-Way Wilkinson Power-Combined Q-Band SiGe Class-E Power Amplifier with 23% Peak PAE", In Proceedings of IEEE Compound Semiconductor Integrated Circuit Symposium, La Jolla, CA, US, Oct. 14-17, 2012, pp. 1-4.

Datta, K., "Analysis, Design and Implementation of mm-Wave SiGe Stacked Class-E Power Amplifiers", In Proceedings of IEEE Radio Frequency Integrated Circuits Symposium, Seattle, WA, US, Jun. 2-3, 2013, pp. 275-278.

Dickson, T. et al., "The Invariance of Characteristic Current Densities in Nanoscale MOSFETs and its Impact on Algorithmic Design Methodologies and Design Porting of Si(Ge) (Bi)CMOS High-Speed Building Blocks", In IEEE Journal of Solid-State Circuits, vol. 41, No. 8, Aug. 2006, pp. 1830-1845.

Ezzeddine, A.K. and Huang, H.C., "The High Voltage/High Power FET", In Proceedings of IEEE Radio Frequency Integrated Circuits Symposium (RFIC), Philadelphia, PA, US, Jun. 8-10, 2003, pp. 215-218.

FCC, "Revision of Part 15 of the Commission's Rules Regarding Operation in the 57-64 GHz Band", Technical Report, Aug. 2013, pp. 1-2, http://hraunfoss.fcc.gov/edocs_public/attachmatch/FCC-13-112A1.pdf.

Gogineni, U. et al., "RF Power Potential of 45 nm CMOS Technology", In Proceedings of the Tropical Meeting on Silicon Monolithic Integrated Circuits in RF Systems (SiRF '10), New Orleans, LA, US, Jan. 11-13, 2010, pp. 204-207.

Haldi, P. et al., "CMOS Compatible Transformer Power Combiner", In Electronics Letters, vol. 42, No. 19, Sep. 2006, pp. 1091-1092.

Haque, U. et al., "Combined RF and Multilevel PWM Switch Mode Power Amplifier", In Proceedings of IEEE NORCHIP, Vilnius, LT, Nov. 11-12, 2013, pp. 1-4.

Hasani, J.Y. and Kamarei, M., "Analysis and Optimum Design of a Class E RJ Power Amplifier", In IEEE Transactions on Circuits and Systems I: Regular Papers, vol. 55, No. 6, Jul. 2008, pp. 1759-1768.

Heydari, B. et al., "Millimeter-Wave Devices and Circuit Blocks up to 104GHz in 90nm CMOS", In IEEE Journal of Solid-State Circuits, vol. 42, No. 12, Dec. 2007, pp. 2893-2903.

ITU, "Recommendation p. 676: Attenuation by Atmospheric Gases", last updated Sep. 2016, pp. 1-33, https://www.itu.int/rec/R-REC-P.676/recommendation.asp?lang=en&parent=R-REC-P.676-11-201609-I.

Johnson, E., "Physical Limitations on Frequency and Power Parameters of Transistors", In IRE International Convention Record, vol. 13, Mar. 1965, pp. 27-34.

Kalantari, N. and Buckwalter, J.F., "A 19.4dBm, Q-Band Class-E Power Amplifier in a 0.12um SiGe BiCMOS Process", In IEEE Microwave and Wireless Components Letters, vol. 20, No. 5, May 2010, pp. 283-285.

Kee, S., "The Class E/F Family of Harmonic-Tuned Switching Power Amplifiers", Ph.D. Dissertation, Department of Electrical Engineering, California Institute of Technology, Pasadena, CA, US, Dec. 2001, pp. 1-185, available at: http://resolver.caltech.edu/CaltechETD:etd-04262005-152703.

Kim, J.G. and Rebeiz, G., "Miniature Four-Way and Two-Way 24 GHz Wilkinson Power Dividers in 0.13 um CMOS", In IEEE Microwave and Wireless Components Letters, vol. 17, No. 9, Sep. 2007, pp. 658-660.

Ko, S. and Lin, J., "A Linearized Cascode CMOS Power Amplifier", In Proceedings of IEEE Annual Wireless Microwave Technology Conference (WAMICON), Clearwater Beach, FL, US, Dec. 4-5, 2006, pp. 1-4.

Krishnaswamy, H. and Hashemi, H., "Inductor and Transformer-Based Integrated RF Oscillators: A Comparative Study", In Proceedings of IEEE Custom Integrated Circuits Conference (CICC '06), San Jose, CA, US, Sep. 10-13, 2006, pp. 381-384.

Lai, J. and Valdes-Garcia, V., "A 1V 17.9dBm 60GHz Power Amplifier in Standard 65nm CMOS", In Proceedings of the IEEE International Solid-State Circuits Conference Digest of Technical Papers (ISSCC '10), San Francisco, CA, US, Feb. 7-11, 2010, pp. 424-425.

Law, C.Y. and Pham, A.V., "A High Gain 60Ghz Power Amplifier with 20dBm Output Power in 90nm CMOS", In Proceedings of the IEEE International Solid-State Circuits Conference (ISSCC '10), San Francisco, CA, US, Feb. 7-11, 2010, pp. 426-427.

Lee, O. et al., "A Charging Acceleration Technique for Highly Efficient Cascode Class-E CMOS Power Amplifiers", In the IEEE Journal of Solid-State Circuits, vol. 45, No. 10, Oct. 2010, pp. 2184-2197.

Martineau, B. et al., "A 53-68 GHz 18 dBm Power Amplifier with an 8-Way Combiner in Standard 65 nm CMOS", In IEEE International Solid-State Circuits Conference Digest Technical Papers, Feb. 2010, pp. 428-429.

Mazzanti, A. et al., "Analysis of Reliability and Power Efficiency in Cascode Class-E PAs", In IEEE Journal of Solid-State Circuits, vol. 41, No. 5, May 2006, pp. 1222-1229.

McRory, J.G. et al., "Transformer Coupled Stacked FET Power Amplifiers", In IEEE Journal of Solid-State Circuits, vol. 34, No. 2, Feb. 1999, pp. 157-161.

Morshed, T.H. et al., "BSIM4.4.7 MOSFET Model User's Manual", Department of Electrical Engineering and Computer Sciences, University of California, Berkeley, 2011, pp. 1-184.

Nicolson, S. et al., "A 1.2 V, 140 GHz Receiver with On-Die Antenna in 65 nm CMOS", In IEEE Radio Frequency Integrated Circuits Symposium, Jun. 2008, pp. 229-232.

Niknejad, A. et al., "Nanoscale CMOS for mm-Wave Applications", In IEEE Compound Semiconductor Integrated Circuits Symposium (CSICS), Portland, OR, US, Oct. 2007, pp. 1-4.

Ogunnika, O.T. and Valdes-Garcia, A., "A 60GHz Class-E Tuned Power Amplifier with PAE >25% in 32nm SOI CMOS", In Proceedings of IEEE Radio Frequency Integrated Circuits Symposium (RFIC '12), Montreal, QC, CA, Jun. 17-19, 2012, pp. 65-68.

Pfeiffer, U.R. and Goern, D., "A 20 dBm Fully-Integrated 60GHz SiGe Power Amplifier with Automatic Level Control", In IEEE Journal of Solid-State Circuits, vol. 42, No. 7, Jul. 2007, pp. 1455-1463.

Pfeiffer, U.R. and Goren, D., "A 23-dBm 60-GHz Distributed Active Transformer in a Silicon Process Technology", In IEEE Transactions on Microwave Theory and Techniques, vol. 55, No. 5, May 2007, pp. 857-865.

Piazzon, L. et al., "New Generation of Multi-Step Doherty Amplifier", In Proceedings of IEEE European Microwave Integrated Circuits Conference (EuMIC), Manchester, UK, Oct. 10-11, 2011, pp. 116-119.

Pornpromlikit, S. et al., "A Q-Band Amplifier Implemented with Stacked 45-nm CMOS FETs", In Proceedings of the IEEE Compound Semiconductor Integrated Circuit Symposium (CSICS '11), Waikoloa, HI, US, Oct. 16-19, 2011, pp. 1-4.

Pronpromlikit, S. et al., "A 33-dBm 1.9-GHz Silicon-on-Insulator CMOS Stacked-FET Power Amplifier", In Proceedings of IEEE Microwave Theory and Techniques Symposium (MTTS), Boston, MA, US, Jun. 7-12, 2009, pp. 533-536.

Reynaert, P. and Steyaert, M.S., "A 1.75GHz GSM/EDGE Polar Modulated CMOS RF Power Amplifier", In IEEE Journal of Solid-State Circuits, vol. 40, No. 12, Feb. 2005, pp. 2598-2608.

Sandstrom, D. et al., "94 GHz Power-Combining Power Amplifier with +13dBM Saturated Output Power in 65 nm CMOS", In Proceedings of IEEE Radio Frequency Integrated Circuits Symposium (RFIC), Baltimore, MD, US, Jun. 5-7, 2011, pp. 1-4.

Sarkas, I. et al., "A 45nm SOI CMOS Class-D mm-Wave PA with >10Vpp Differential Swing", In Proceedings of IEEE International Solid-State Circuits Conference (ISSCC), San Francisco, CA, US, Feb. 19-23, 2012, pp. 88-89.

Sengupta, K. et al., "On-Chip Sensing and Actuation Methods for Integrated Self-Healing mm-Wave CMOS Power Amplifier", In Proceedings of IEEE International Microwave Symposium (IMS2012), Montreal, CA, Jun. 17-22, 2012, pp. 1-3.

Sharma, J. and Krishnaswamy, H., "215GHz CMOS Signal Source Based on a Maximum-Gain Ring Oscillator Topology", In Proceedings of the IEEE International Microwave Symposium (IMS2012), Montreal, CA, Jun. 17-22, 2012, pp. 1-3.

(56) References Cited

OTHER PUBLICATIONS

Shirinfar, F. et al., "A Fully Integrated 22.6dBm mm-Wave PA in 40nm CMOS", In Proceedings of IEEE Radio Frequency Integrated Circuits Symposium (RFIC), Seattle, WA, US, Jun. 2-4, 2013, pp. 279-282.
Siligaris, A. et al., "A 60 GHz Power Amplifier with 14.5 dBm Saturation Power and 25% Peak PAE in CMOS 65nm SOI", In IEEE Journal of Solid-State Circuits, vol. 45, No. 7, Jul. 2010, pp. 1286-1294.
Sokal, N.O. and Sokal, A.D., "Class E—A New Class of High-Efficiency Tuned Single-Ended Switching Power Amplifiers", In IEEE Journal of Solid-State Circuits, vol. 10, No. 3, Jun. 1975, pp. 168-176.
Tai, W. et al., "A 0.7W Fully Integrated 42GHz Power Amplifier with 10% PAE in 0.13m SiGe BiCOMS", In Proceedings of IEEE International Solid-State Circuits Conference (ISSCC), San Francisco, CA, US, Feb. 17-21, 2013, pp. 142-144.
Wang, C. et al., "Improved Design Technique of a Microwave Class-E Power Amplifier with Finite Switching-on Resistance", In Proceedings of IEEE Radio and Wireless Conference (RAWCON), Aug. 10-13, 2003, pp. 241-244.
Wang, C., "CMOS Power Amplifiers for Wireless Communicaitons", Ph.D. Dissertation, California Institute of Technology, La Jolla, San Diego, CA, US, 2003, pp. 1-159.
Wang, H. et al., "Data Rate and Spectrum Requirements for IEEE 802.11 aj (45 GHz)", Sep. 27, 2012, pp. 1-19, https://mentor.ieee.org/802.11/dcn/12/11-12-1196-01-00aj-data-rate-and-spectrum-requirements-for-ieee-802-11aj-45-ghz.pptx.
Wang, H. et al., "MM-Wave Integration and Combinations", In IEEE Microwave Magazine, vol. 13, No. 5, Jul./Aug. 2012, pp. 49-57.
Wang, K. et al., "A 1V 19.3 dBm 79 GHz Power Amplifier in 65 nm CMOS", In IEEE International Solid-State Circuits Conference Digest of Technical Papers (ISSCC '12), San Francisco, CA, US, Feb. 19-23, 2012, pp. 260-262.
Wicks, B. et al., "A 60-GHz Fully-Integrated Doherty Power Amplifier Based on 0.13 µm CMOS Process", In Proceedings of IEEE Radio Frequency Integrated Circuits Symposium (RFIC), Atlanta, GA, US, Jun. 15-17, 2008, pp. 69-72.
Xing, W. et al., "11aj 45GHz Link Budget for Use Cases Discussion", last updated Nov. 2012, pp. 1-10, available at: https://mentor.ieee.org/802.11/dcn/12/11-12-1320-00-00aj-45ghz-link-budget-for-use-cases-discussion.pptx.
Xu, H. et al., "A Highly Linear 25 dBm Outphasing Power Amplifier in 32 nm CMOS for WLAN Application", In Proceedings of the 2010 European Solid-State Circuits Conference (ESSCIRC '10), Sevilla, ES, Sep. 14-16, 2010, pp. 306-309.
Yang, W. et al., "BSIMSOIv4.4 MOSFET Model User's Manual", BSIM Group, Department of Electrical Engineering and Computer Sciences, University of California, Berkeley, Dec. 2010, pp. 1-128.
Yue, C.P. and Wong, S.S., "On-Chip Spiral Inductors with Patterned Ground Shields for Si-Based RF ICs", In IEEE Journal of Solid-State Circuits, vol. 33, No. 5, May 1998, pp. 743-752.
Zhao, D. and Reynaert, P., "14.1 A 0.9 V 20.9 dBm 22.3%—PAE E-Band Power Amplifier with Broadband Parallel-Series Power Combiner in 40 nm CMOS", In IEEE International Solid-State Circuits Conference Digest Technical Papers, Feb. 2014, pp. 248-249.
Zhao, D. and Reynaert, P., "A 60GHz Outphasing Transmitter in 40nm CMOS with 15.6dBm Output Power", In Proceedings of IEEE International Solid-State Circuits Conference (ISSCC), San Francisco, CA, US, Feb. 19-23, 2012, pp. 170-172.
Zhao, D. et al., "A 60 GHz Dual-Mode Power Amplifier with 17.4 dBm Output Power and 29.3% PAE in 40-nm CMOS", In Proceedings of IEEE European Solid-State Circuit Conference (ESSCIRC), Bodeaux, FR, Sep. 17-21, 2012, pp. 337-340.
Zhao, Y. et al., "Compact Transformer Power Combiners for Millimeter-Wave Wireless Applications", In Proceedings of IEEE Radio Frequency Integrated Circuits Symposium (RFIC), Anaheim, CA, US, May 23-25, 2010, pp. 223-226.

Abbasi, M. et al., "A Broadband Differential Cascode Power Amplifier in 45 nm CMOS for High-Speed 60 GHz System-on-Chip", In IEEE Symposium on Radio Frequency Integrated Circuits (RFIC '10), May 23-25, 2010, pp. 533-536.
Baek, D. et al., "Analysis on Resonator Coupling and its Application to CMOS Quadrature VCO at 8 GHz", In IEEE Radio Frequency Integrated Circuits Symposium, Jun. 2003, pp. 85-88.
Chakrabarti, A. and Krishnaswamy, H., "Millimeter-Wave Digital Polar Phased Array Transmitter", Technical Report, Sep. 29, 2014, pp. 1-25.
Chakrabarti, A. et al., "Multi-Output Stacked Class-En mmWave Power Amplifiers in 45nm SOI CMOS", In IET Microwaves, Antennas & Propagation, vol. 9, No. 13, Oct. 2015, pp. 1425-1435.
Chen, A. et al., "An 83-GHz High-Gain SiGe BiCMOS Power Amplifier Using Transmission-Line Current-Combining Technique", In IEEE Transactions on Microwave Theory and Techniques, vol. 61, No. 4, Mar. 2013, pp. 1557-1569.
Chowdhury, D. et al., "A Fully-Integrated Efficient CMOS Inverse Class-D Power Amplifier for Digital Polar Transmitters", In the IEEE Journal of Solid-State Circuits, vol. 47, No. 5, May 2012, pp. 1113-1122.
Ezzeddine, A. et al.. "High-Voltage FET Amplifiers for Satellite and Phased-Array Applications", In IEEE Transactions on Microwave Theory and Techniques, St. Louis, MO, US, Jun. 4-6, 1985, pp. 336-339.
Fathi, M. et al., "A Stacked 6.5-GHz 29.6-dBm Power Amplifier in Standard 65-nm CMOS", In IEEE Conference on Custom Integrated Circuits (CICC '10), Sep. 19-22, 2010, pp. 1-4.
Frlan, E. et al., "Computer-Aided Design of Square Spiral Transformers and Inductors", In Proceedings of the IEEEE Microwave Theory and Techniques Symposium, Jun. 1989, pp. 661-664.
International Patent Application No. PCT/US2012/032218, filed Apr. 4, 2012.
International Preliminary Report on Patentability dated Oct. 17, 2013 in International Patent Application No. PCT/US2012/032218.
International Search Report and Written Opinion dated Jul. 27, 2012 in International Patent Application No. PCT/US2012/032218.
Kee, S.D. et al., "The Class-E/F Family of ZVS Switching Amplifiers", In IEEE Transactions on Microwave Theory and Techniques, vol. 51, No. 6, Jun. 2003, pp. 1677-1690.
Pornpromlikit, S. et al. "A Watt-Level Stacked-FET Linear Power Amplifier in Silicon-on-Insulator CMOS", In IEEE Transactions on Microwave Theory and Techniques, Dec. 2010, pp. 57-64.
Rabjohn, G.G., "Monolithic Microwave Transformers", Masters English Thesis, Carleton University, Ottawa, ON, CA, Apr. 1991, pp. 1-162.
Sharma, J. and Krishnaswamy, H., "216- and 316-GHz 45-nm SOI CMOS Signal Sources Based on a Maximum-Gain Ring Oscillator Topology", In IEEE Transactions on Microwave Theory Technology, vol. 61, No. 1, Jan. 2013, pp. 492-504.
Shibata, K. et al., "Microstrip Spiral Directional Coupler", In IEEE Transactions on Microwave Theory and Techniques, vol. 29, Jul. 1981, pp. 680-689.
Shifrin, M. et al., "A New Power Amplifier Topology with Series Biasing and Power Combining of Transistors", In IEEE Microwave and Millimeter-Wave Monolithic Circuits Symposium, Jun. 1-3, 1992, pp. 39-41.
Shopov, S. et al., "A 19dBm, 15 Gbaud, 9 bit SOI CMOS Power-DAC Cell for High-Order QAM W-Band Transmitters", In IEEE Journal of Solid-State Circuits, vol. 49, No. 7, Jul. 2014, pp. 1653-1664.
Son, K.Y. et al., "A 1.8-GHz CMOS Power Amplifier using Stacked nMOS and pMOS Structures for High-Voltage Operation", In IEEE Transaction son Microwave Theory and Techniques, Oct. 2009, pp. 2652-2660.
Soyeur, M. et al., "Multilevel Monolithic Inductors in Silicon Technology", In Electronics Letters, vol. 31, No. 5, Mar. 1995, pp. 359-360.
Straayar, M. et al., "A Low-Noise Transformer-Based 1.7 GHz CMOS VCO", In Internatonal Solid-State Circuits Conference Digest of Technical Papers, vol. 1, Feb. 2002, pp. 286-287.

(56) References Cited

OTHER PUBLICATIONS

Tsai, K.C. "CMOS Power Amplifiers for Wireless Communicaitons", Ph.D. Dissertation, California Institute of Technology, La Jolla, San Diego, CA, US, Dec. 2007, pp. 1-250.
Wikipedia, "Microwave", last modified Mar. 25, 2016, pp. 1-11, available at: http://en.wikipedia.org/wiki/Microwave#Uses.
Notice of Allowance dated Oct. 5, 2016 in U.S. Appl. No. 14/873,177, pp. 1-17.
Office Action dated Feb. 9, 2015 in U.S. Appl. No. 14/009,854, pp. 1-13.
Office Action dated Feb. 16, 2016 in U.S. Appl. No. 14/873,177, pp. 1-51.
Office Action dated Jul. 5, 2017 in U.S. Appl. No. 15/250,447, pp. 1-28.
Office Action dated Sep. 11, 2015 in U.S. Appl. No. 14/009,854, pp. 1-8.
Office Action dated Dec. 1, 2017 in U.S. Appl. No. 15/250,447, pp. 1-10.
U.S. Appl. No. 14/873,177, filed Oct. 1, 2015, pp. 1-15.
Circuits for forming a power amplifier, U.S. Appl. No. 61/471,645, filed Apr. 4, 2011, pp. 1-17.
Circuits for forming a power amplifier, U.S. Appl. No. 61/620,361, filed Apr. 4, 2012, pp. 1-25.
Circuits for forming a power amplifier U.S. Appl. No. 62/058,603, filed Oct. 1, 2014, pp. 1-28.
Hasani et al., "Transmission line Inductor Modeling and Design for Milimeter Wave Circuits in Digital CMOS Process," 2007 IEEE International Workshop on Radio-Frequency Integration Technology, Rasa Sentosa Resort, 2007, pp. 290-293.
Wagh, Poojan. "The Binary Number System—Part 2: Binary Weighting." Circuit Design, Jun. 30, 2008, www.circuitdesign.info/blog/2008/06/the-binary-number-system-part-2-binary-weighting/.
Notice of Allowance dated Jun. 11, 2018 in U.S. Appl. No. 15/250,447.
Office Action dated Jun. 14, 2018 in U.S. Appl. No. 15/401,547.

\* cited by examiner

CIRCUITS FOR POWER-COMBINED POWER AMPLIFIER ARRAYS

CROSS REFERENCE TO RELATED APPLICATION

This application claims the benefit of U.S. Provisional Patent Application No. 61/948,198, filed Mar. 5, 2014, which is hereby incorporated by reference herein in its entirety.

STATEMENT REGARDING GOVERNMENT FUNDED RESEARCH

This invention was made with government support under grant FA8650-10-1-7042 awarded by the Defense Advanced Research Projects Agency. The government has certain rights in the invention.

BACKGROUND

Burgeoning long-range communications applications, such as satellite communication in the 45 GHz band and high data-rate wireless backhaul in the 71-76 GHz and 81-86 GHz bands, have driven the need for the development of high-power, energy-efficient long-range communication circuitry, such as power amplifiers.

However, existing power amplifier and combiner architectures do not provide a means for compact large-scale power combining in a linear manner to achieve watt-class output powers at mmWave frequencies.

Accordingly, new circuits for power-combined power amplifier arrays are desirable.

SUMMARY

Circuits for power-combined power amplifier arrays are provided. In some embodiments, the circuits for power combined-power amplifier arrays comprise: an input splitter coupled to an input that provides a plurality of outputs; a plurality of power amplifier unit cells, each power amplifier unit cell coupled to a corresponding output of the input splitter and each power amplifier unit cell providing an output signal at an output of the power amplifier unit cell; and a power combiner having an output, a plurality of inputs, each input coupled to the output of a corresponding power amplifier unit cell, and a plurality of C-L-C-section equivalents, each having an input connected to a corresponding one of the plurality of inputs of the power combiner and an output connected to the output of the power combiner.

DETAILED DESCRIPTION

Circuits for power-combined power amplifier arrays are provided. In some embodiments, these circuits include an input splitter that splits an input signal, an array of power amplifier unit cells that each receive the split input signal and provide an output signal, and a non-isolating power combiner that receive the output signals from the power amplifier unit cells and combines these signals so that a single combined output can be provided. In some embodiments, the power amplifier unit cells are selectable so that only m of the total available unit cells are powered on at a given point in time. In some embodiments, the power combiner can include an array of spiral inductors that are each connected to an output of a corresponding power amplifier unit cell on one side the inductor and to an output of the power combiner on the other side of the inductor.

Figure 1:
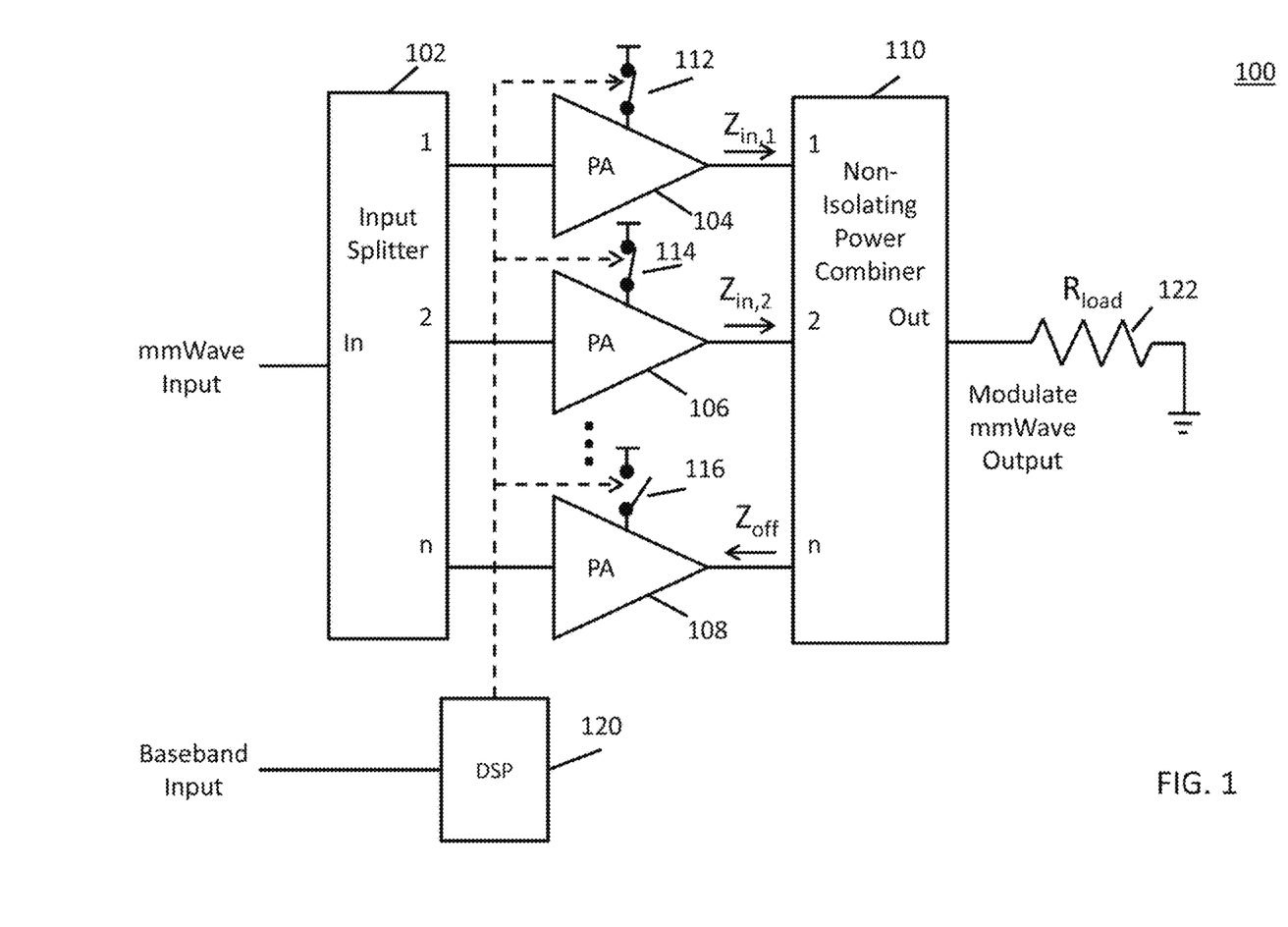
FIG. 1 is an example of a block diagram of a circuit for a power-combined power amplifier array including selectable power amplifier unit cells in accordance with some embodiments.

Turning to FIG. 1, an example 100 of a block diagram of a circuit for a power-combined power amplifier array including selectable power amplifier unit cells in accordance with some embodiments is shown. This circuit can be used for any suitable application. For example, in some embodiments, this circuit can be used for a digital-mmWave power amplifier array.

As illustrated, circuit 100 includes an input splitter 102, an array of power amplifier unit cells 104, 106, and 108, a non-isolating power combiner 110, switches 112, 114, and 116, a digital signal processor (DSP) 120, and a load resistor 122.

As described above, input splitter 102 splits an input signal so that the input signal can be provided from a single point to the power amplifier unit cells. Input splitter 102 can be implemented in any suitable manner. For example, as described below in connection with FIGS. 5 and 7, the input splitter can be implemented as a tree of transmission lines.

Each of power amplifier unit cells 104, 106, and 108 amplify the signal from the input splitter when the unit cell is turned ON. Whether a unit cells is turned ON or OFF may be controlled by a signal from DSP 120 which controls switches 112, 114, and 116. Any suitable unit cells, any suitable switches, and any suitable DSP can be used. In some embodiments, DSP 120 can also be omitted when not needed and any other suitable mechanism for controlling the switches can be provided.

Power combiner 110 receives the outputs of the ON unit cells, combines the outputs into a single signal, and drives load $R_{load}$ 122. As described below, in some embodiments, power combiner may be implemented using a set of spiral inductors. Load $R_{load}$ 122 can be any suitable load in some embodiments.

Figure 2:
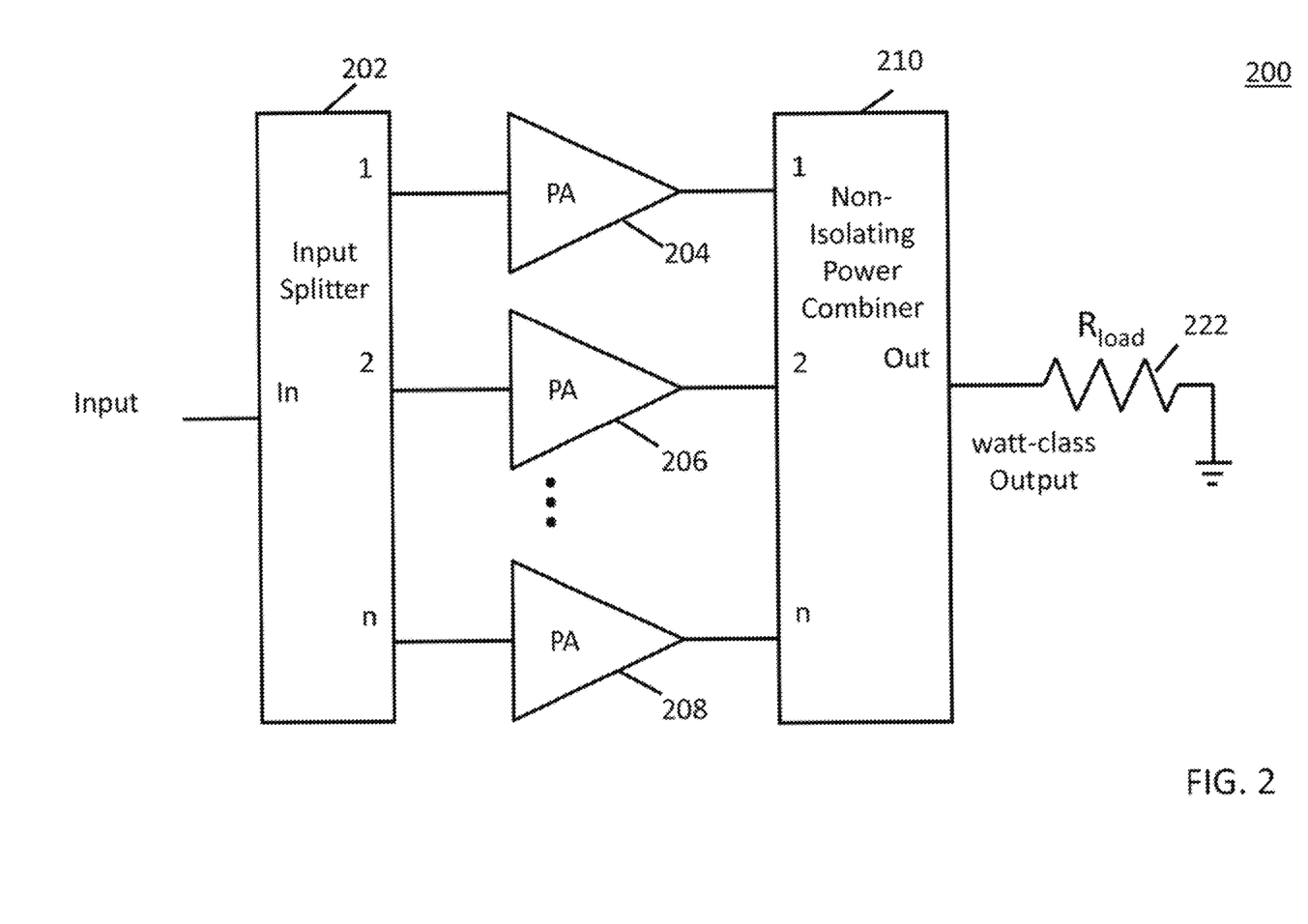
FIG. 2 is an example of a block diagram of a circuit for a power-combined power amplifier array including non-selectable power amplifier unit cells in accordance with some embodiments.

Turning to FIG. 2, an example 200 of a block diagram of a circuit for a power-combined power amplifier array including non-selectable power amplifier unit cells in accordance with some embodiments is shown. This circuit can be used for any suitable application. For example, in some embodiments, this circuit can be used for a watt-class power amplifier array.

As illustrated, circuit 200 includes an input splitter 202, an array of power amplifier unit cells 204, 206, and 208, a non-isolating power combiner 210, and a load resistor 122.

Input splitter 202 splits an input signal so that the input signal can be provided from a single point to the power amplifier unit cells. Input splitter 202 can be implemented in any suitable manner. For example, as described below in connection with FIGS. 5 and 7, the input splitter can be implemented as a tree of transmission lines.

Each of power amplifier unit cells 204, 206, and 208 amplify the signal from the input splitter.

Power combiner 210 receives the outputs of the unit cells, combines the outputs into a single signal, and drives load $R_{load}$ 222. As described below, in some embodiments, power combiner may be implemented using a set of spiral inductors. Load $R_{load}$ 222 can be any suitable load in some embodiments.

Any suitable number of input splitter outputs, power amplifier unit cells, and power combiner inputs can be used in the examples of FIGS. 1 and 2 in some embodiments. For example, in some embodiments, the number of these components can be an even number, such as eight, twelve, or sixteen. In some embodiments, for each of its inputs, the power combiner can include a single spiral conductor connected to the input and to a single output of the power combiner.

As discussed above, in some embodiments and instances, it may be desirable to turn OFF one or more of the power amplifier unit cells, while leaving other of the power amplifier unit cells ON. In order to achieve an output amplitude that is proportional to the number of power amplifier unit cells that are ON (m) (i.e., to achieve $A_{out} \propto m$), the following should be true:

the total output power of the power amplifier array ($P_{out}(m)$) should be equal to $m \cdot P_{unit}(m)$ (where $P_{unit}(m)$ is the output power of each of the ON power amplifier unit cells);

$P_{unit}(m)$ should be proportional to $1/R_{in}(m)$ (where $R_{in}(m)$ is the input resistance at the input to the combiner (assuming that the combiner presents a purely resistive impedance to the power amplifier unit-cells)); and $P_{out}(m)$ should be proportional to $m^2$.

Based, on this, it follows that $m \cdot P_{unit}(m)$ should be proportional to $m^2$, $$\frac{m}{R_{in}(m)}$$

should be proportional to $m^2$, and $R_{in}(m)$ should be proportional to $$\frac{1}{m}.$$

Figure 3:
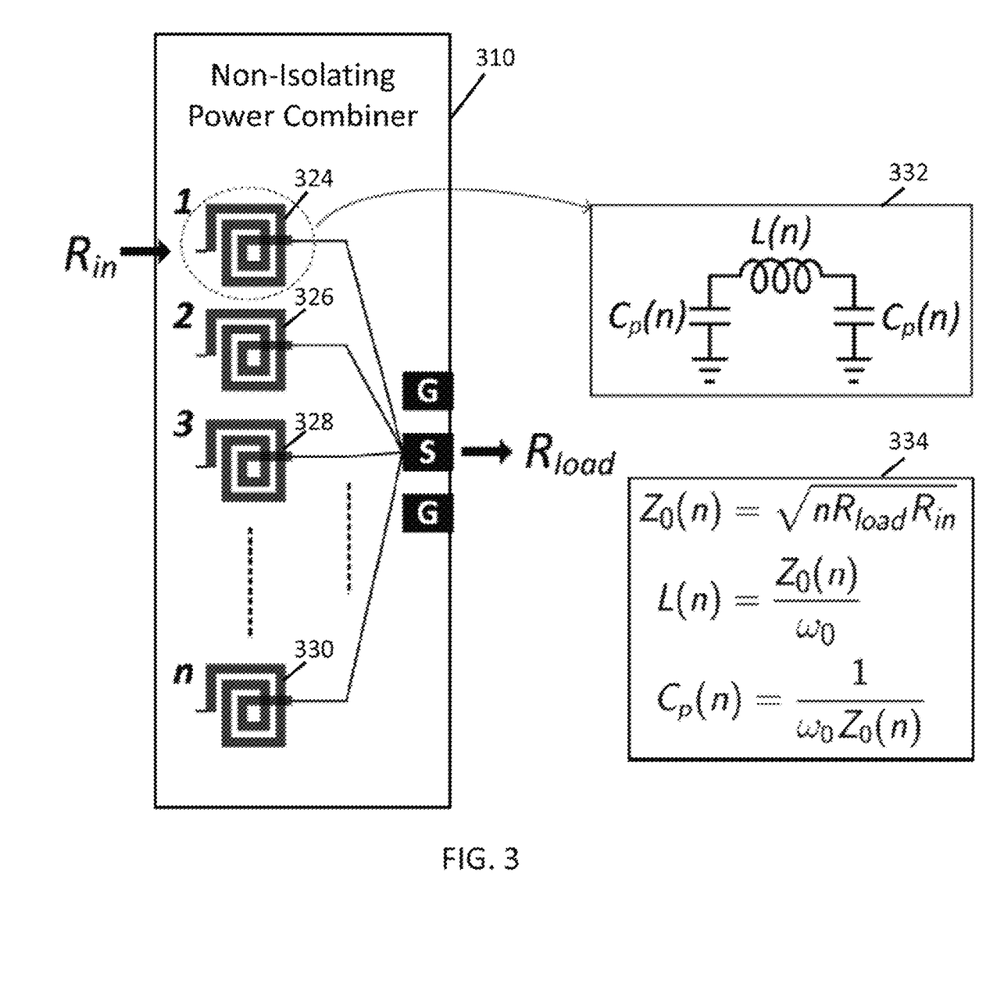
FIG. 3 is an example of a schematic diagram of a non-isolating power combiner in accordance with some embodiments.

In order to address these and other requirements, as shown in the example of FIG. 3, a combiner 310 in accordance with some embodiments can contain a set of lumped C-L-C-section equivalents 324, 326, 328, and 330 (at the desired frequency of operation to $\omega_0$) which each receive the output of a corresponding power amplifier unit cell. These C-L-C-section equivalents can be implemented in any suitable manner. For example, in some embodiments, as shown in FIG. 3, each C-L-C-section equivalent can be realized as a single spiral inductor which behaves equivalently to a C-L-C-section 332 at the desired frequency of operation.

To achieve an equivalent characteristic impedance $Z_0$ necessary for the combiner to be implemented in CMOS back end of line (BEOL) and to achieve the behavior of a quarter-wave transmission line at the desired frequency $\omega_0$, the spiral inductor can be configured to achieve an inductance of $L=Z_0/\omega_0$ and a parasitic capacitance of $C_p=1/(Z_0\omega_0)$ on either side as seen in box 334 of FIG. 3. If $R_{load}$ is the load impedance seen by the combiner and $R_{in}$ is the desired input impedance, then $L=\sqrt{nR_{load}R_{in}}/\omega_0$ and $C_p=1/\omega_0\sqrt{nR_{load}R_{in}}$. For instance, an eight-way combiner designed to operate at 45 GHz, to drive a 50Ω load, and to present a 50Ω input impedance at each of its inputs requires L=500 pH with $C_p$=25 fF on either side, giving an effective $Z_0$ of 141.42Ω.

The maximum number of elements that can be combined in a single step using the quarter-wave lumped combiner, with given values for $R_{load}$ and $R_{in}$, is limited by the achievable self-resonant frequency (SRF) of spirals in the BEOL and layout considerations for maintaining symmetry. For example, in some embodiments, the maximum number of elements that can be combined can be found to be sixteen when the combiner is implemented in 45 nm SOI CMOS BEOL for $R_{load}=R_{in}=50Ω$ for which $Z_0=200Ω$ at 45 GHz Although sixteen elements may be found to be the maximum number of elements that can be combined, in some embodiments, fewer elements than that number of elements can be combined. For example, in some embodiments, eight elements can be combined for which the spirals have a $Z_0=141.42Ω$ at 45 GHz. In another example, in some embodiments, twelve elements can be combined, which requires a $Z_0=173.2Ω$ at 45 GHz.

The efficiency $\eta_{comb}$ of the n-way lumped quarter-wave combiner driving $R_{load}$ may be expressed as:

$$\eta_{comb} \approx 1 - \left(\frac{1}{Q_L} + \frac{1}{Q_C}\right)\left(\sqrt{\eta\rho_{comb}} + \frac{1}{\sqrt{\eta\rho_{comb}}}\right). \quad (1)$$

where $Q_L$ is the inductive quality factor of the spiral, $Q_C$ is the quality factor of the parasitic capacitances of the spiral at $\omega_0$, and $\rho_{comb}$ (the ideal impedance transformation performed by the combiner) may be expressed as:

$$\rho_{comb} = \frac{R_{load}}{R_{in}} = n\left(\frac{R_{load}}{Z_0}\right)^2.$$

Equation (1) can also be written as follows:

$$\eta_{comb} \approx 1 - \left(\frac{1}{Q_L} + \frac{1}{Q_C}\right)\left(\sqrt{\rho_{sec}} + \frac{1}{\sqrt{\rho_{sec}}}\right) \quad (2)$$

where $\rho_{sec}$ equals $n \cdot \rho_{comb}$ and is the impedance transformation performed by each spiral section in the combiner.

Equations (1) and (2) assume that the currents and voltages in an ideal lossless combiner are unaffected by the resistance of the spiral being in series with the inductance of the spiral, and by the resistance of the spiral being in parallel with the capacitances of the spiral.

Based on equation (2), it can be seen that the efficiency of the combiner only depends on $Q_L$, $Q_C$ and $\rho_{sec}$.

Figure 4:
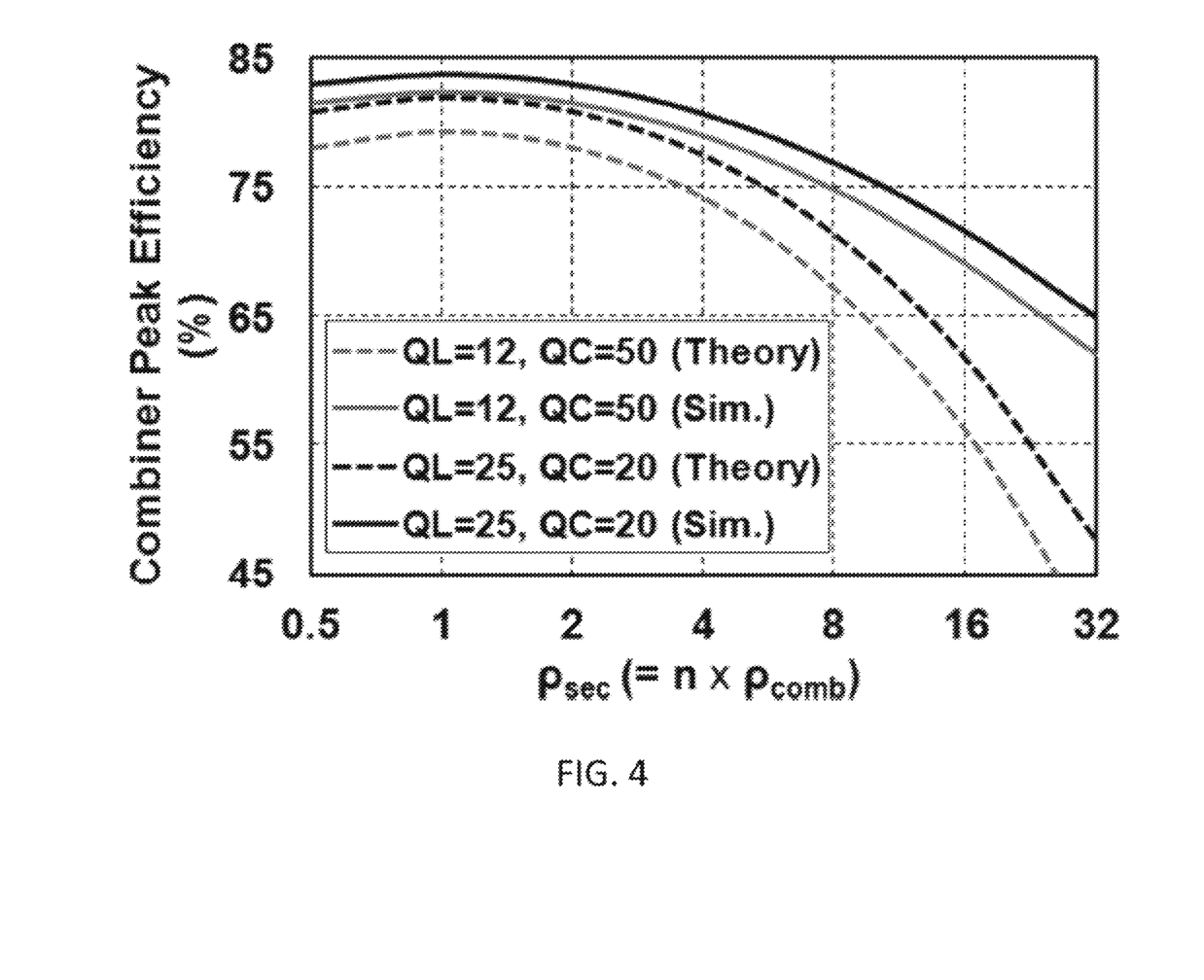
FIG. 4 is a graph showing peak efficiency of a non-isolating power combiner based on various parameters in accordance with some embodiments.

An example of the simulated and theoretical efficiencies of two eight-way combiners with $Q_L=12$, $Q_C=50$ and $Q_L=25$, $Q_C=20$ at 45 GHz in accordance with some embodiments are shown in FIG. 4. As can be seen, the peak efficiency in this example occurs at $\rho_{sec}=1$. Based on this graph, an eight-way combiner with $Q_L=12$, $Q_C=50$, and $\rho_{sec}=16$ (based on a $\rho_{comb}=2$) has an efficiency of 65%. Likewise, based on this graph, an eight-way combiner with $Q_L=25$, $Q_C=20$, and $\rho_{sec}=8$ (based on a $\rho_{comb}=1$) has an efficiency of 75%.

Figure 5:
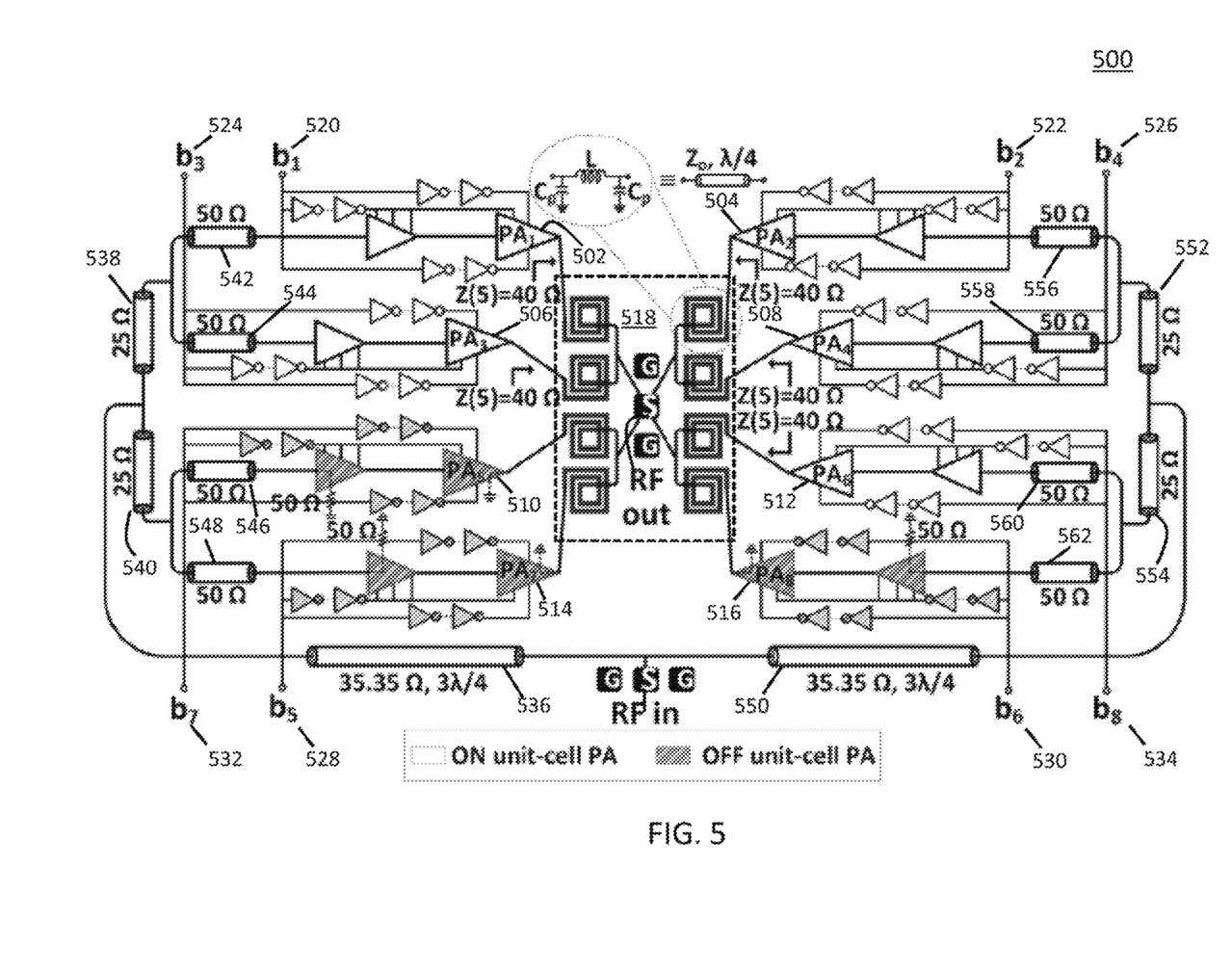
FIG. 5 is an example of a schematic diagram of a circuit for a power-combined power amplifier array including selectable power amplifier unit cells in accordance with some embodiments.
Figure 7:
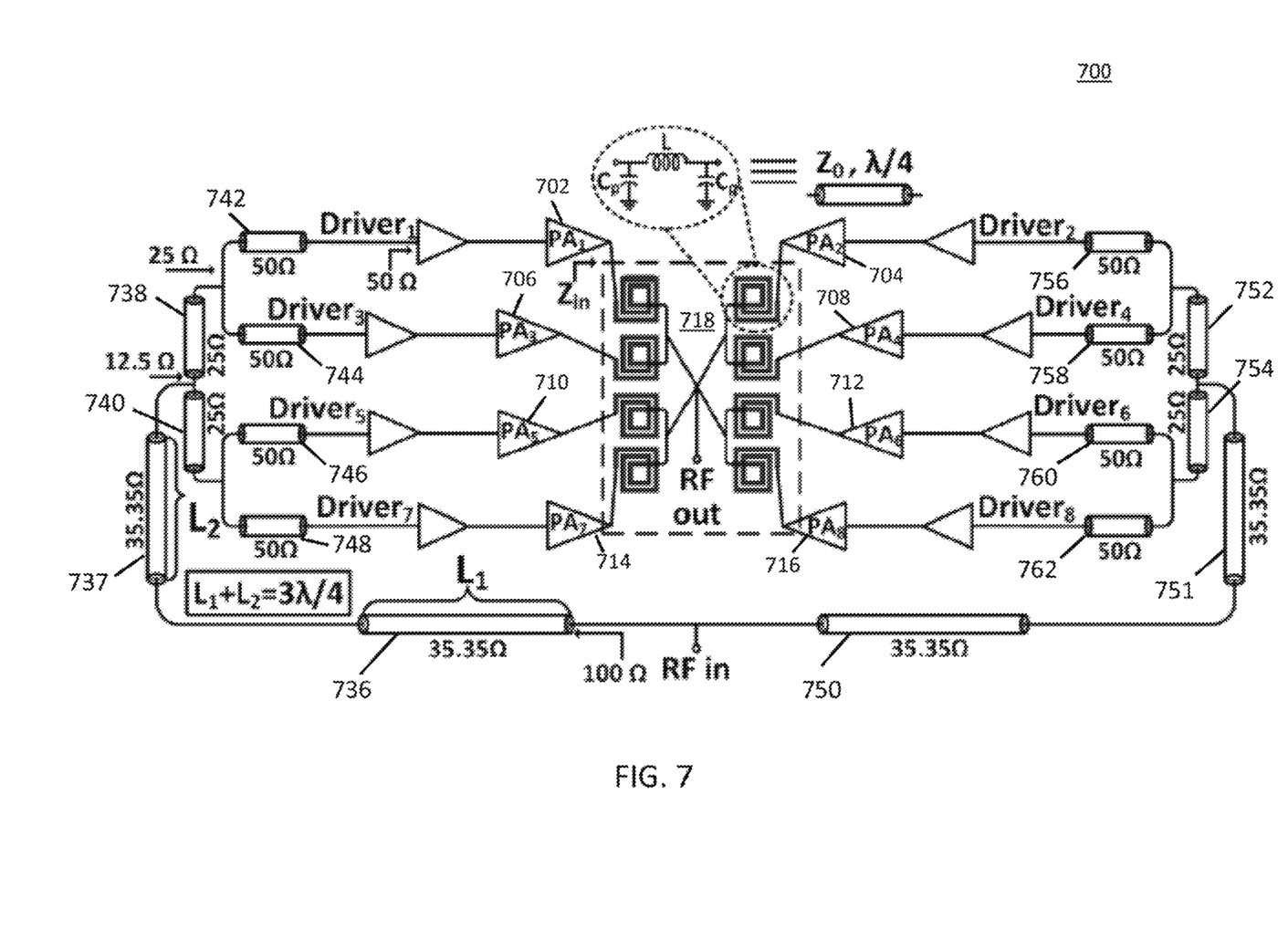
FIG. 7 is an example of a schematic diagram of a circuit for a power-combined power amplifier array including non-selectable power amplifier unit cells in accordance with some embodiments.

Any suitable arrangement of the lumped quarter-wave sections can be used in some embodiments. For example, as shown in FIGS. 5 and 7, in some embodiments, the sections of a combiner can be joined pairwise and then each pair can be connected to an output of the combiner (e.g., an output pad) by means of an intermediary microstrip. Thus, in this example, four microstrips can be used. In some embodiments, it may be beneficial to ensure that the pairwise connections and intermediary microstrips are as short as possible.

As described above, in accordance with some embodiments, one or more of the power amplifier unit cells in an array of such cells may be able to be switched OFF. In some of such embodiments, an OFF unit-cell may be configure to present a short-circuit (or near short-circuit) impedance to the corresponding combiner input. This short-circuit can then be transformed by the corresponding lumped quarter-wave section of the combiner to an open at the output of the combiner thus ensuring that no (or minimal) power is dissipated by the section of the combiner corresponding to the OFF cell. Furthermore, each ON unit-cell may see an impedance $$R_{in}(m) = \frac{Z_0^2}{mR_{load}},$$

which has the desired load modulation effect ($R_{in}(m) \propto 1/m$).

Turning to FIG. 5, an example 500 of a three-bit digital to mmWave power amplifier array in accordance with some embodiments is shown. As illustrated, eight supply switched stacked-FET power amplifier unit-cells PA$_1$ 502, PA$_2$ 504, PA$_3$ 506, PA$_4$ 508, PA$_5$ 510, PA$_6$ 512, PA$_7$ 514, and PA$_8$ 516 are power combined using an eight-way lumped quarter-wave combiner 518.

The combiner is designed to have $R_{in}(8)=25\Omega$ for $R_{load}=50\Omega$ ($\rho_{comb}=2$, L=353 pH, $C_p$=35.4 fF, $Z_0$=100$\Omega$ at 45 GHz).

Eight digital control lines ($b_1$ 520, $b_2$ 522, $b_3$ 524, $b_4$ 526, $b_5$ 528, $b_6$ 530, $b_7$ 532, and $b_8$ 534) determine the ON/OFF state of the unit-cells and thereby determine the power amplifier array's output modulation. The lengths of these digital control lines can be equalized to minimize skew in the digital control word input to the power amplifier array during modulation in some embodiments. As shown in FIG. 5, inverter chains connected to the control lines drive switches in the unit cells and drivers at the inputs of the unit cells to turn the unit cells and drivers ON and OFF.

The eight power amplifier unit-cells receive their input power via two eight-way input power splitters formed from transmission lines 536, 538, 540, 542, 544, 544, 546, and 548, and 550, 552, 554, 556, 558, 560, and 562. As shown, a three-stage design is implemented in which the two stages closest to each power amplifier unit-cell inputs (formed from transmission lines: 542, 544, 546, 548, and 538, 540; and 556, 558, 560, 562, and 552, 554) are designed in a current-splitting fashion and the stage furthest from the unit cell (formed from transmission lines 536 and 550) performs the necessary impedance transformation using a 3λ/4 transmission line. Transmission lines 536 and 550 should be equal in length.

Figure 6:
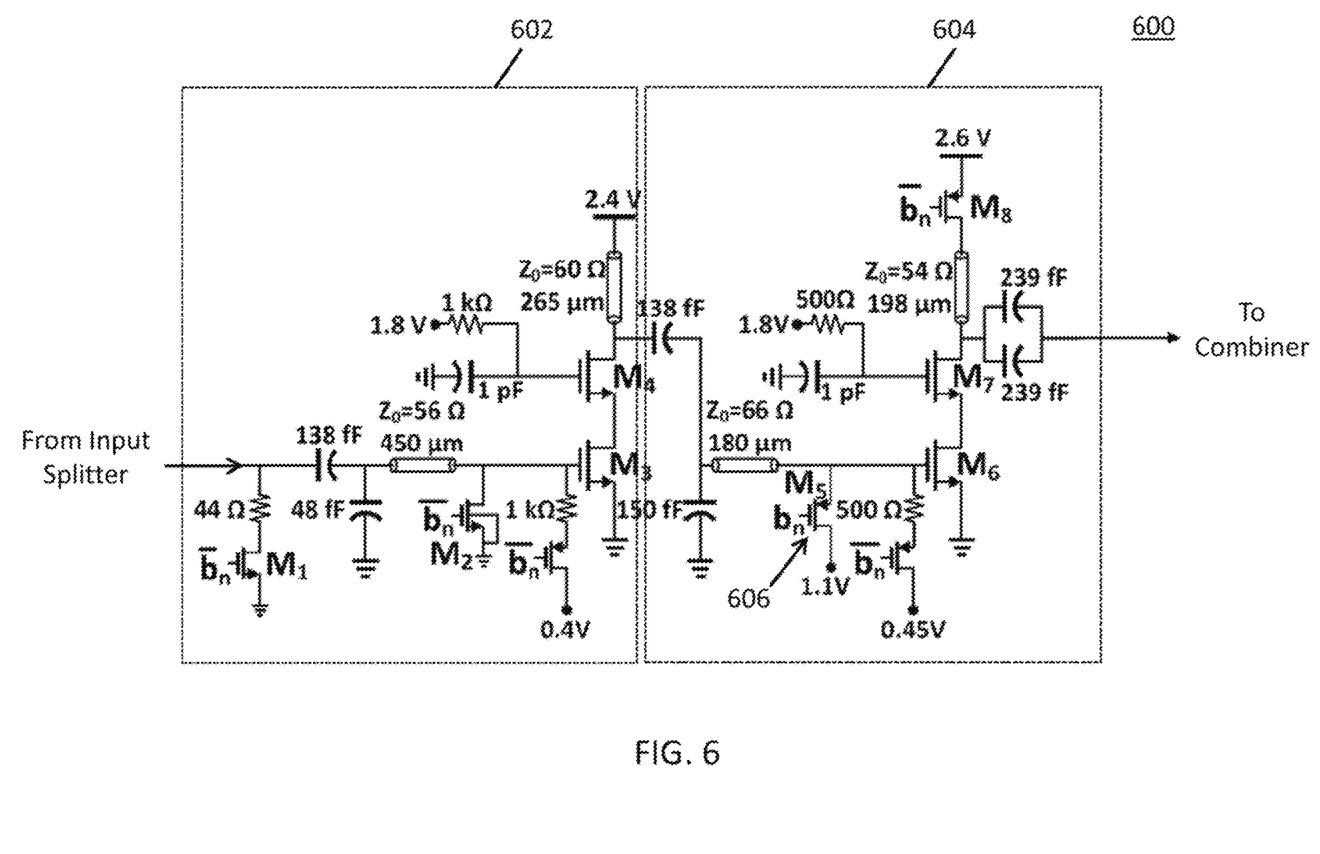
FIG. 6 is an example of a schematic diagram of a power amplifier unit cell and driver that can be used in the circuit of FIG. 5 in accordance with some embodiments.

FIG. 6 shows an example of a power amplifier unit cell and driver circuit 600 that can be used in circuit 500 in accordance with some embodiments. As shown circuit 600, includes a two-stacked Class-E-like driver stage 602 followed by a two-stacked class-E-like main amplifier stage 604. When the unit cells and drivers are OFF, these components consume minimal power, preserve input match with respect to the input splitter as a whole and the transmission lines in the third stage of the input splitter, and present a short-circuit (or near short circuit) impedance to the combiner.

In some embodiments, the OFF resistance of a unit cell ($R_{off}$) can be configured to match the equivalent source resistance of the ON power amplifier unit cells (e.g., 15Ω). For example, in some embodiments, this can be done by configuring the bias voltage applied at the drain of transistor $M_5$ (which bias voltage is illustrated in FIG. 6 as being 1.1V).

Turning to FIG. 7, an example 700 of a 33-46 GHz watt-class power amplifier array in accordance with some embodiments is shown. As illustrated, eight supply switched stacked-FET power amplifier unit-cells PA$_1$ 702, PA$_2$ 704, PA$_3$ 706, PA$_4$ 708, PA$_5$ 710, PA$_6$ 712, PA$_7$ 714, and PA$_8$ 716 are power combined using an eight-way lumped quarter-wave combiner 718.

The combiner is designed to have $R_{in}(8)=50\Omega$ for $R_{load}=50\Omega$ ($\rho_{comb}=1$, L=500 pH, $C_p$=25 fF, $Z_0$=141.42Ω at 45 GHz). In the combiner of FIG. 7, each spiral's outer dimensions are 86 μm×86 μm, and the distance between adjacent spirals was chosen to be greater than 45 μm, which can significantly reduce the coupling and the maximum difference in $|\Gamma_{in}|$ Unlike circuit 500 of FIG. 5, no mechanism for individually turning the power amplifier unit cells ON and OFF is implemented in the embodiment illustrated in FIG. 7.

Like in circuit 500, in circuit 700 the eight power amplifier unit-cells receive their input power via two four-way input power splitters (which together act as one eight-way input power splitter) formed from transmission lines 736, 737, 738, 740, 742, 744, 744, 746, and 748, and 750, 751, 752, 754, 756, 758, 760, and 762. As shown in FIG. 7, the 3λ/4 transmission line of FIG. 5 can be split into two transmission lines 736, 737 and 750, 751, in some embodiments. Transmission line pairs 736, 737 and 750, 751 should be equal lengths.

Figure 8:
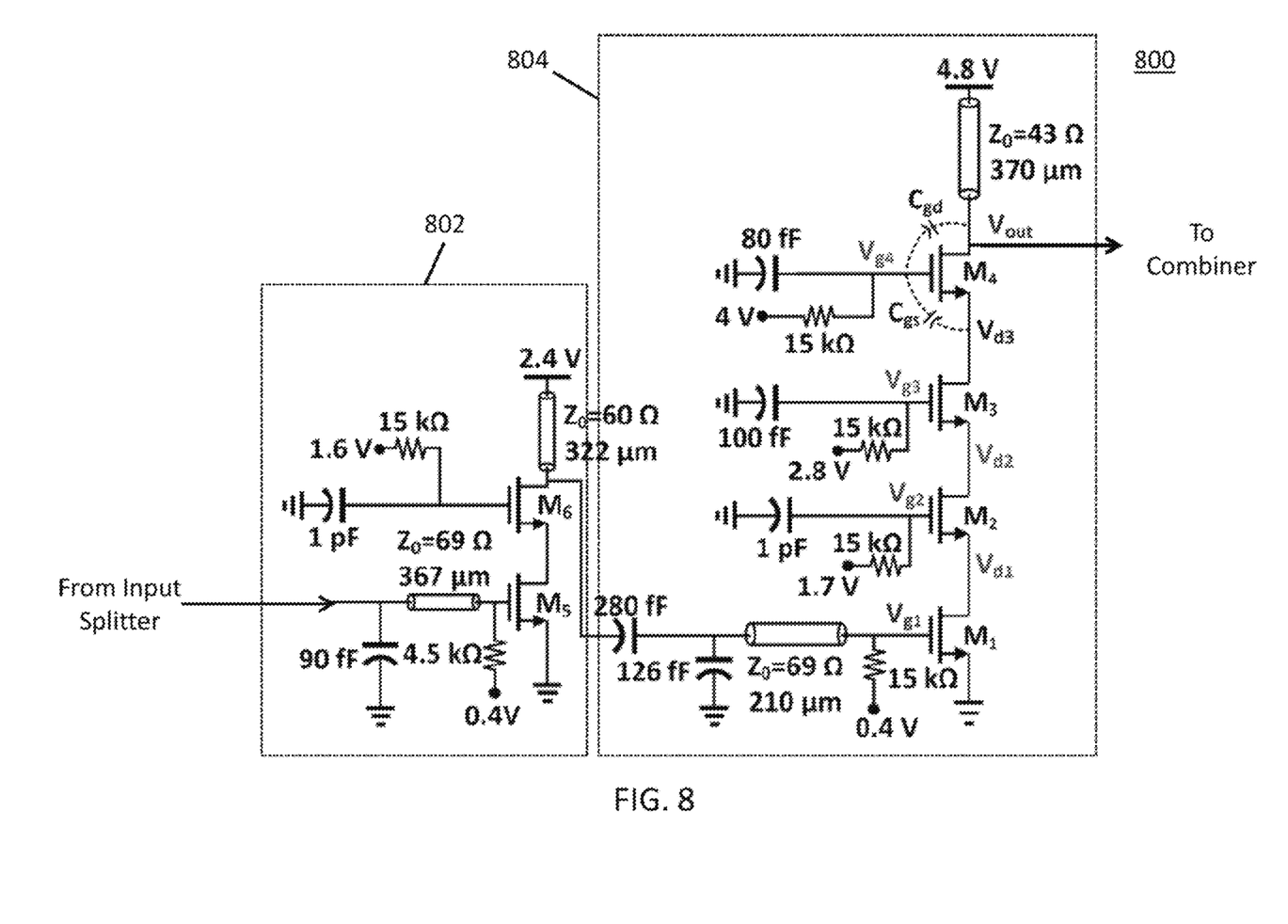
FIG. 8 is an example of a schematic diagram of a power amplifier unit cell and driver that can be used in the circuit of FIG. 7 in accordance with some embodiments.

FIG. 8 shows an example of a power amplifier unit cell and driver circuit 800 that can be used in circuit 700 in accordance with some embodiments. As shown circuit 800, includes a two-stacked Class-E-like driver stage 802 followed by a four-stacked class-E-like power amplifier stage 804. For long-term reliability, the maximum voltage swing across any two device terminals is limited to a peak value of $2 \times V_{dd}=2.4V$.

The provision of the examples described herein (as well as clauses phrased as "such as," "e.g.," "including," and the like) should not be interpreted as limiting the subject matter to the specific examples; rather, the examples are intended to illustrate only some of many possible aspects.

Although the invention has been described and illustrated in the foregoing illustrative embodiments, it is understood that the present disclosure has been made only by way of example, and the numerous changes in the details of implementation of the invention can be made without departing from the spirit and scope of the invention, which is only limited by the claims that follow. Features of the disclosed embodiments can be combined and rearranged in various ways.

What is claimed is:

1. A circuit for a power-combined power amplifier array, comprising:
    an input splitter, coupled to an input, that provides a plurality of outputs;
    a plurality of power amplifier unit cells, each power amplifier unit cell coupled to a corresponding output of the input splitter, each power amplifier unit cell providing an output signal at an output of the power amplifier unit cell, and each power amplifier unit cell being configured to turn on and off in response to a baseband signal; and
    a power combiner having an output, a plurality of inputs, each input coupled to the output of a corresponding power amplifier unit cell, and a plurality of C-L-C-section equivalents, each having an input connected to a corresponding one of the plurality of inputs of the power combiner and an output connected to the output of the power combiner, and each of the plurality of C-L-C section equivalents being equivalent to a sub-circuit including:
    a first capacitor having a first side connected to the input of the C-L-C section equivalent and having a second side connected to a voltage level;
    an inductor having a first side connected to the input of the C-L-C section equivalent and having a second side connected to the output of the C-L-C section equivalent; and
    a second capacitor having a first side connected to the output of the C-L-C section equivalent and having a second side connected to the voltage level.

2. The circuit of claim 1, wherein each C-L-C-section equivalent is a spiral conductor.

3. The circuit of claim 1, further comprising a plurality of switches each configured to control whether a corresponding one of the power amplifier unit cells is powered ON or OFF.

4. The circuit of claim 3, further comprising a digital signal processor that controls the plurality of switches.

5. The circuit of claim 1, wherein the input splitter is formed from a tree of transmission lines.

6. The circuit of claim 1, wherein the voltage level is a ground.

* * * * *